(12) United States Patent
Osato et al.

(10) Patent No.: US 7,303,404 B2
(45) Date of Patent: Dec. 4, 2007

(54) CONTACT AND ELECTRICAL CONNECTING APPARATUS

(75) Inventors: Eichi Osato, Fuchu (JP); Yoshihito Goto, Fuchu (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/603,361

(22) Filed: Nov. 21, 2006

(65) Prior Publication Data
US 2007/0072449 A1 Mar. 29, 2007

(51) Int. Cl.
*H01R 12/00* (2006.01)
(52) U.S. Cl. ....................................................... 439/71
(58) Field of Classification Search ................. 439/71, 439/862, 66, 73, 70, 83, 575
See application file for complete search history.

(56) References Cited
U.S. PATENT DOCUMENTS 6,964,573 B2 * 11/2005 Asai et al. .................... 439/71
6,974,331 B2 * 12/2005 Brown et al. ................. 439/66
6,994,565 B2 * 2/2006 Harper, Jr. .................... 439/66
7,118,401 B2 * 10/2006 McHugh et al. ............. 439/330
7,156,705 B2 * 1/2007 Soh ............................. 439/862

FOREIGN PATENT DOCUMENTS

| JP | 2001-060482 | 3/2001 |
| JP | 2003-123874 | 4/2003 |
| JP | 2003-232805 | 8/2003 |
| JP | 2004-061390 | 2/2004 |

* cited by examiner

*Primary Examiner*—J. F. Duverne
(74) *Attorney, Agent, or Firm*—Jeffrey J. King (57) ABSTRACT

A contact includes: a first and a second conductive contact pieces and at least one sheet-like electrical insulator such as polyimide. Each contact piece has a sheet-like body portion having a base portion, an elongate portion extending from the base portion, and a conductive contact portion formed in the base portion; and a terminal contact portion formed in the elongate portion. Both base potions are made to confront each other in their thickness direction with an electrical insulator interposed, such that one of the terminal contact portions, without being in electrical contact with the second contact piece, extends toward the second base portion, while the other terminal contact portion, without being in electrical contact with the first contact piece, extends toward the first base portion.

11 Claims, 11 Drawing Sheets

CONTACT AND ELECTRICAL CONNECTING APPARATUS

CROSS REFERENCE TO RELATED APPLICATIONS

This application claims the priority benefit of copending PCT/JP2004/008072, filed Jun. 3, 2004 which is incorporated herein by reference.

TECHNICAL FIELD

The present invention relates to a contact and an electrical connecting apparatus to be used for electric test of a semiconductor device such as an integrated circuit.

BACKGROUND OF THE INVENTION

An inspection or a test of electric characteristics of a packaged or molded semiconductor device, in particular, an integrated circuit (IC), is generally conducted by utilizing an inspection socket, i.e., a test socket for removably mounting a semiconductor device as an auxiliary unit for inspection.

In one of electrical connecting apparatus of this type, a plurality of probes, i.e., contacts bent substantially in J-shape are used (Japanese Patent Appln. Public Disclosure (KOKAI) No. 2003-123874).

In this prior art, each contact comprises a base portion bent substantially in J-shape, a pair of plate-like contact pieces each having a conductive contact portion formed in the base portion and a terminal contact portion formed in the conductive contact portion, and a sheet-like electrical insulator disposed between both contact pieces. Accordingly, the contact has a three-layer structure with one contact piece, the electrical insulator and the other contact piece.

The contact is either is set at substantially the same thickness as or a little thicker than the width dimension of a plate-like terminal of a semiconductor device.

One of the two conductive contact portions is pressed against one conductive portion formed in a base plate, while the other of the conductive contact portions is pressed against the other conductive portion formed in the base plate. Both terminal contact portions are pressed against the terminal of the semiconductor device.

The contact is made to stand with its thickness direction oriented in the horizontal direction of the electrical connecting apparatus and is incorporated into the electrical connecting apparatus. At this time, the border between one contact piece and the electrical insulator as well as the border between the electrical insulator and the other contact piece extends in the extending direction of the terminal.

When inspecting the semiconductor device, the terminal of the semiconductor device is pressed against the terminal contact portion of the contact so that the extending direction of the terminal may coincide with the extending direction of the contact.

At this time, the terminal is positioned between one and the other of the contact pieces, and the border between the one contact piece and the electrical insulator as well as the border between the electrical insulator and the other contact piece extends in the extending direction of the terminal, so that one and the other terminal contact portions are brought into electrical contact with the right and left parts of the plate-like bottom face of the terminal.

Thereby, since one and the other contact pieces are electrically connected with one terminal, the electrical connecting apparatus and the semiconductor device can constitute a Kelvin connection.

However, when the connecting position of the terminal is displaced in the thickness direction of the contact, it is possible to electrically connect the terminal with the one contact piece, but it is sometimes not possible to electrically contact the terminal with the other contact piece.

In such a case, the terminal is electrically connected with one contact piece but not with the other contact piece. Accordingly, since the electrical connecting apparatus and the semiconductor device cannot constitute a Kelvin connection, the electrical connecting apparatus cannot conduct a Kelvin inspection of the semiconductor device.

Such a semiconductor device is judged as a defective product even if electrical characteristics are good. Therefore, a high dimensional tolerance is required for a semiconductor device and a terminal.

SUMMARY OF THE DISCLOSURE OF THE INVENTION

Problems to Be Solved by the Invention

An object of the present invention lies in ensuring a Kelvin connection between contact pieces of an electrical connecting apparatus and terminals of a semiconductor device.

Means for the Invention to Solve

A contact according to the present invention comprises a first contact piece, a second contact piece and at least one sheet-like electrical insulator. The first contact piece includes a plate-like first body portion, and a first terminal contact portion. The first body portion has a first base portion, a first elongate portion extending from said first base portion, and a first conductive contact portion formed in the first base portion and pressed against one conductive portion formed in a base plate. The first terminal contact portion is formed in the first elongate portion and pressed against a terminal of a semiconductor device. The second contact piece includes a plate-like second body portion and a second terminal contact portion. The second body portion has a second base portion, a second elongate portion extending from the second base portion, and a second conductive contact portion formed in the second base portion and pressed against the other conductive portion formed in the base plate. The second terminal contact portion is formed in the second elongate portion and pressed against said terminal. The electrical insulator is disposed between the first base portion and the second base portion. The first and second base portions are made to confront in their thickness direction, interposing the electrical insulator. The first terminal contact portion extends toward the second base portion without being brought into electrical contact with said second contact piece. The second terminal contact portion extends toward the first base portion without being brought into electrical contact with the first contact piece.

The electrical insulator preferably has a first contact preventing portion for preventing electric contact between the first terminal contact portion and the second base portion as well as electric contact between the second terminal contact portion and the first base portion.

The electrical insulator has a second contact preventing portion projected in a gap formed between the first terminal portion and the second terminal contact portion and for preventing electrical contact between the first terminal contact portion and the second terminal contact portion.

The second contact preventing portion may be formed in the first contact preventing portion.

The first terminal contact portion may have, in said thickness direction, a thickness dimension greater than the total dimension of the thickness of the second body portion and the thickness of the electrical insulator, and the same as or smaller than the total dimension of the thickness of the first body portion, the thickness of the electrical insulator and the thickness of the second body portion. The second terminal contact portion has, in said thickness direction, a thickness dimension greater than the total dimension of the thickness of the first body portion and the thickness of the electrical insulator, and the same as or smaller than the total dimension of the thickness of the first body portion, the thickness of the electrical insulator and the thickness of the second body portion.

There may be formed a space between the first conductive contact portion and the second conductive contact portion.

The electrical insulator may include a pair of confronted electrical insulation sheets, between which an adhesive may be disposed.

The electrical connecting apparatus according to the present invention is used as an apparatus for electrically connecting a plurality of terminals of a semiconductor device and a conductive portion formed on one of the faces of the base plate. Such apparatus comprises a plurality of the contacts and an assembler for assembling the contacts into the base plate in parallel. The assembler is provided with: a plate-like body assembled into the base plate and having a plurality of slits extending in the direction intersecting the aligning direction of the contacts at intervals in the aligning direction of the contacts; and at least one elastic body disposed in the plate-like body in a state of extending in the aligning direction of the contacts and for assembling the contacts into the plate-like body. The first and second terminal contact portions of each contact extend through the slit.

The first body portion is preferably bent substantially in J-like shape from the first terminal contact portion to the first conductive contact portion, while the second body portion is bent substantially in J-like shape from the second terminal contact portion to the second conductive contact portion, and the elastic body is in contact with the substantially J-shaped curved portion of the contact.

Each of the first and second body portions has a substantially S-like shape having a first arcuate portion and a second arcuate portion; the first and second terminal contact portions are respectively positioned outside the second arcuate portion; the first and second conductive contact portions are respectively positioned outside the second arcuate portion; the assembler has at least two elastic bodies, one of which may abut the inside of the first arcuate portion, while the other of which may be in contact with the inside of the second arcuate portion.

It is possible to constitute such that each of the first and second body portions has a substantially U-like shape with two linear portions parallel to each other and a curved portion formed between both linear portions and connecting both linear portions, that the first and second elongate portions are respectively formed in one of the linear portions, and that the first and second conductive contact portions are respectively formed in the other of the linear portion.

Effect of the Invention

According to the present invention, the first and second base portions are made to confront each other in their thickness direction with the electrical insulator interposed. The first terminal contact portion extends toward the second base portion without coming into electrical contact with the second contact piece, and the second terminal contact portion extends toward the first base portion without coming into electrical contact with the first contact piece. Further, the first and second terminal contact portions extend in the thickness direction of the first and second base portions, i.e., in a direction orthogonal to the extending direction of the terminal of the semiconductor device.

Since this enables the first and second terminal contact portions to come electrically in contact with the terminal of the semiconductor device over a wide range, the Kelvin connection between the contacts and the terminal can be surely made.

Also, electrical contact between the first contact piece and the second base portion can be surely prevented by forming, in the electrical insulator of the contact, the first contact preventing portion for preventing electrical contact between the first terminal contact portion and the second base portion as well as for preventing electrical contact between the second terminal contact portion and the first base portion, and the second contact preventing portion projecting into a gap formed between the first and second terminal contact portions and for preventing electrical contact between the first terminal contact portion and the second terminal contact portion.

The terminal can be electrically connected to the first and second terminal contact portions by giving them in their thickness direction a thickness dimension greater than the total thickness dimension of the first and second body portions and the electrical insulator and the same as or less than the total thickness dimension of the first body portion, the electrical insulator and the second body portion.

Also, by forming a space between the first conductive contact portion and the second conductive contact portion, a space is formed between the electrical insulator and one and the other of the conductive portions. This makes it hard for the electrical insulator enter between the first conductive contact portion and one of the conductive portions as well as between the second conductive contact portion and the other of the conductive portions, thereby ensuring a Kelvin connection between the contact and the terminal.

The electrical insulator includes a pair of electrical insulating sheet confronting each other, and by disposing an adhesive between the pair of electrical insulating sheets, both electrical insulating sheets are relatively movable in parallel. Due to this, when the contact is pressed against the terminal and the pair of conductive portions in a state of being inclined to the terminal and the pair of conductive portions, both contact pieces relatively move against the adhesive strength of the adhesive. This makes the first and second conductive contact portions to surely come into contact with the terminal and the conductive portion, respectively.

EXPLANATION OF REFERENCE NUMERALS 10, 10a, 84, 110 contact
semiconductor device
14, 82 electrical connecting apparatus
16a, 16b, 86a, 86b, 112a, 112b first and second contact pieces
18, 88, 130 electrical insulator
20a, 20b, 90a, 90b, 116a, 116b first and second base portions
22a, 22b, 92a, 92b, 118a, 118b first and second elongate portions
24a, 24b, 94a, 94b, 120a, 120b first and second conductive contact portion
26a, 26b, 96a, 96b, 122a, 122b first and second body portions
28a, 28b, 98a, 98b, 124a, 124b first and second terminal contact portions
30a, 30b first and second rear ends
first contact preventing portion
second contact preventing portion
88b, 130b contact preventing portion
base plate
38a, 38b first and second conductive portions
terminal of semiconductor device
elastic body Best Mode for Carrying Out the Invention Contact Referring to FIGS. 1 through 4, a contact 10 is used as a probe of an electrical connecting apparatus 14 (see FIG. 7) in an inspection or a test of a semiconductor device 12 (see FIG. 7) such as an integrated circuit.

The contact 10 includes a first and a second conductive contact pieces 16a and 16b and at least one sheet-like electrical insulator 18 such as polyimide.

The first contact piece 16a is provided with a plate-like first body portion 26a and a first terminal contact portion 28a. The first body portion 26a has a base portion 20a, a first elongate portion 22a extending from the first base portion 20a, a first conductive contact portion 24a formed in the first base portion 20a. The first terminal contact portion 28a is formed in the first elongate portion 22a.

The second contact piece 16b is provided with a plate-like second body portion 26b and a second terminal contact portion 28b. The second body portion 26b has a base portion 20b, a second elongate portion 22b extending from the second base portion 20b, and a second conductive contact portion 24b formed in the second base portion 20b. The second terminal contact portion 28b is formed in the second elongate portion 22b.

Figure 1:
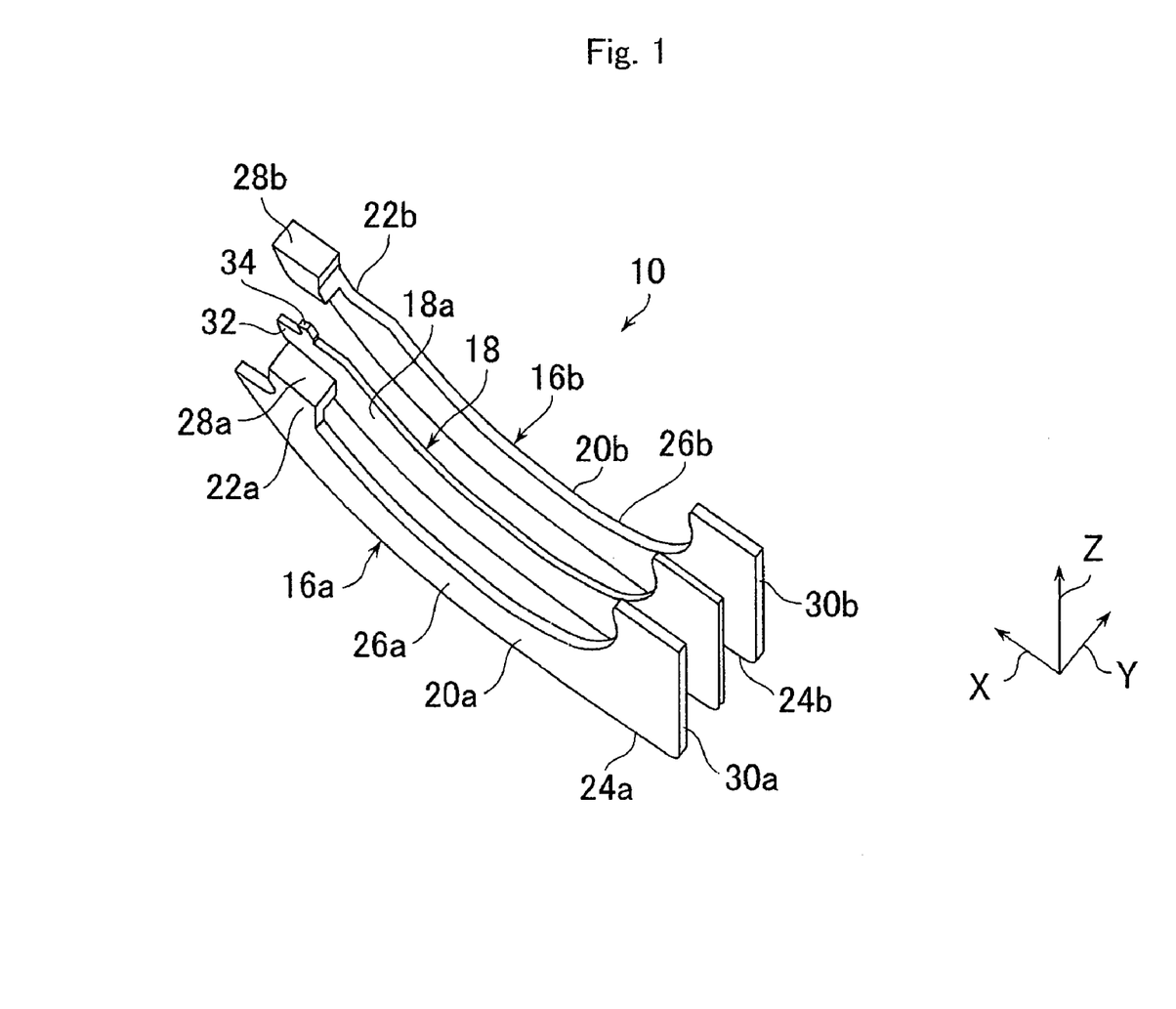
FIG. 1 is an exploded perspective view showing a first embodiment of the contact according to the present invention.
Figure 2:
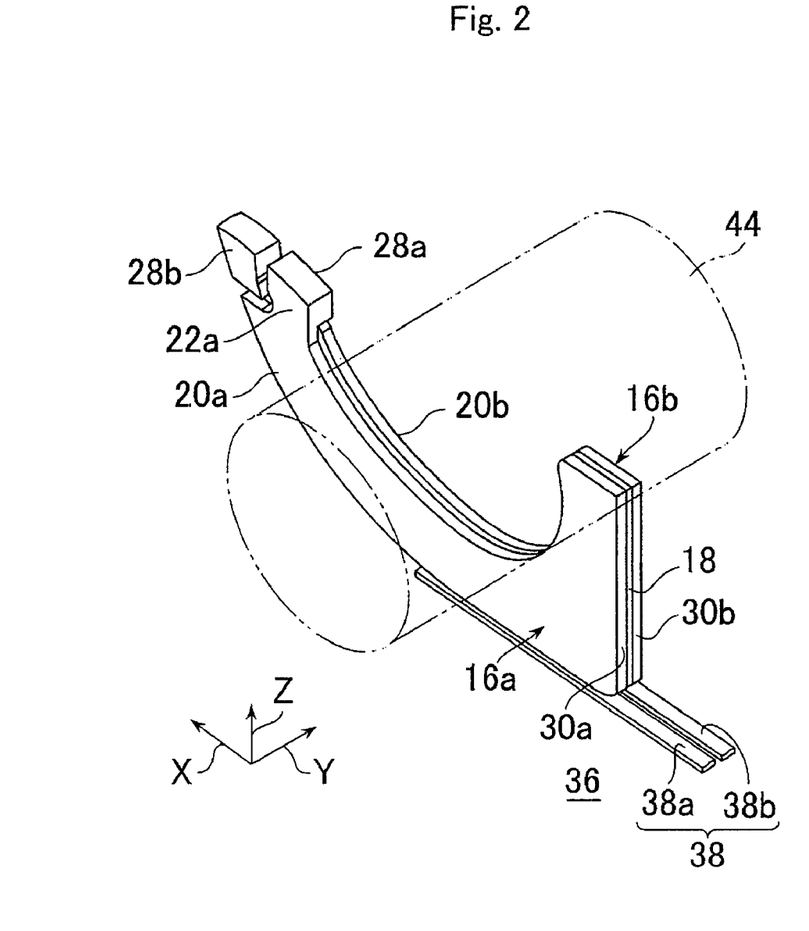
FIG. 2 is a perspective view of the contact shown in FIG. 1.

The first base portion 20a has a read end 30a extending in a Z direction. The second base portion 20b has a rear end 30b extending in parallel in the Z direction.

The first conductive contact portion 24a extends from an end portion in an X direction of a first body portion 26a. The second conductive contact portion 24b extends from an end portion in the X direction of a second body portion 26b.

The first and second base portions 20a and 20b have a substantially J-like shape. Also, the shapes and dimensions of the first base portion 20a and the second base portion 20b are made substantially the same.

Figure 4:
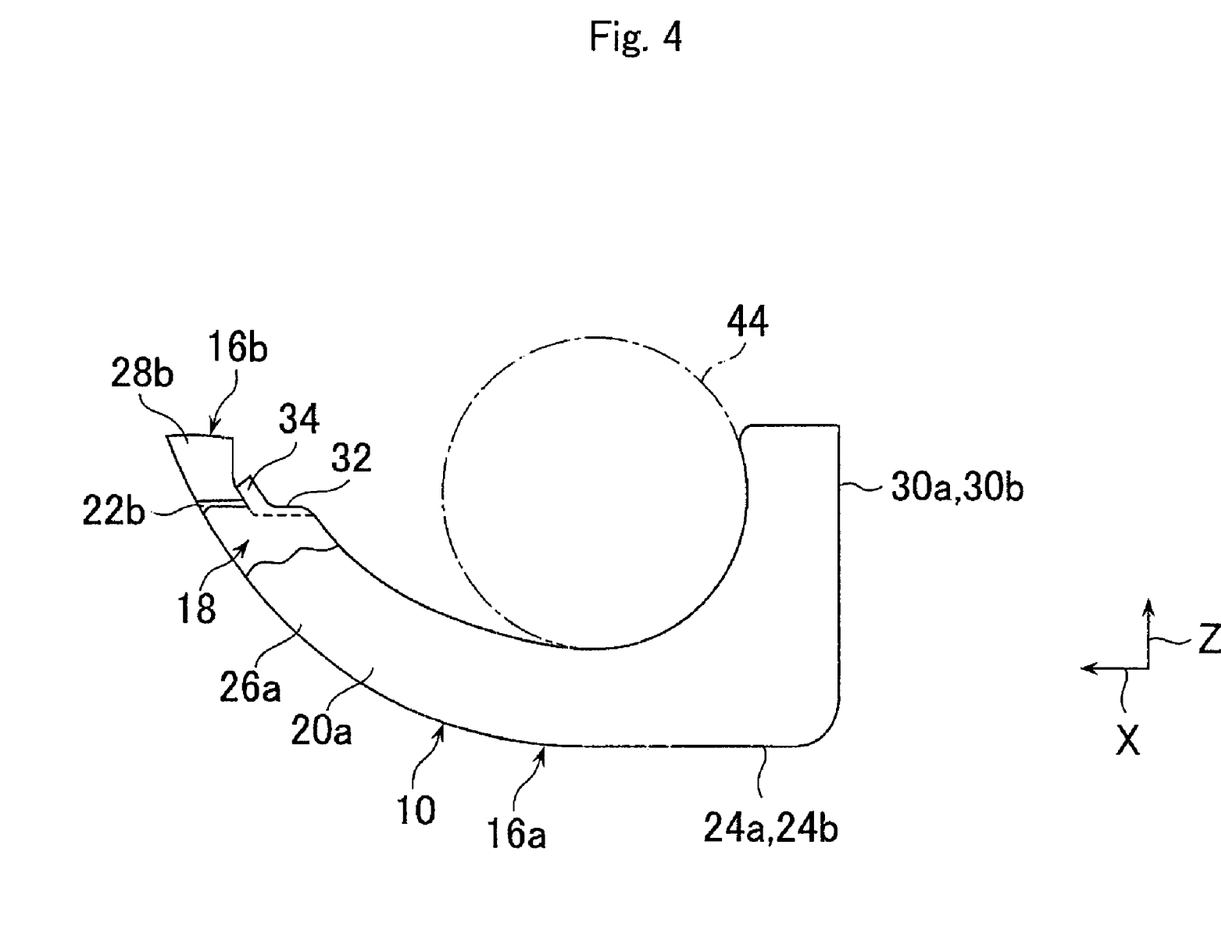
FIG. 4 is a front elevation in which part of the contact shown in FIG. 3C is omitted.

The first elongate portion 22a is formed at the front end of the first base portion 20a and on the right side in FIG. 4. The second elongate portion 22b is formed at the front end of the second base portion 20b and on the left side in FIG. 4.

The first base portion 20a and the second base portion 20b are made to confront each other in their thickness direction (Y direction), interposing the electrical insulator 18 therebetween. The electrical insulator 18 is disposed between the first base portion 20a and the second base portion 20b.

Figure 7:
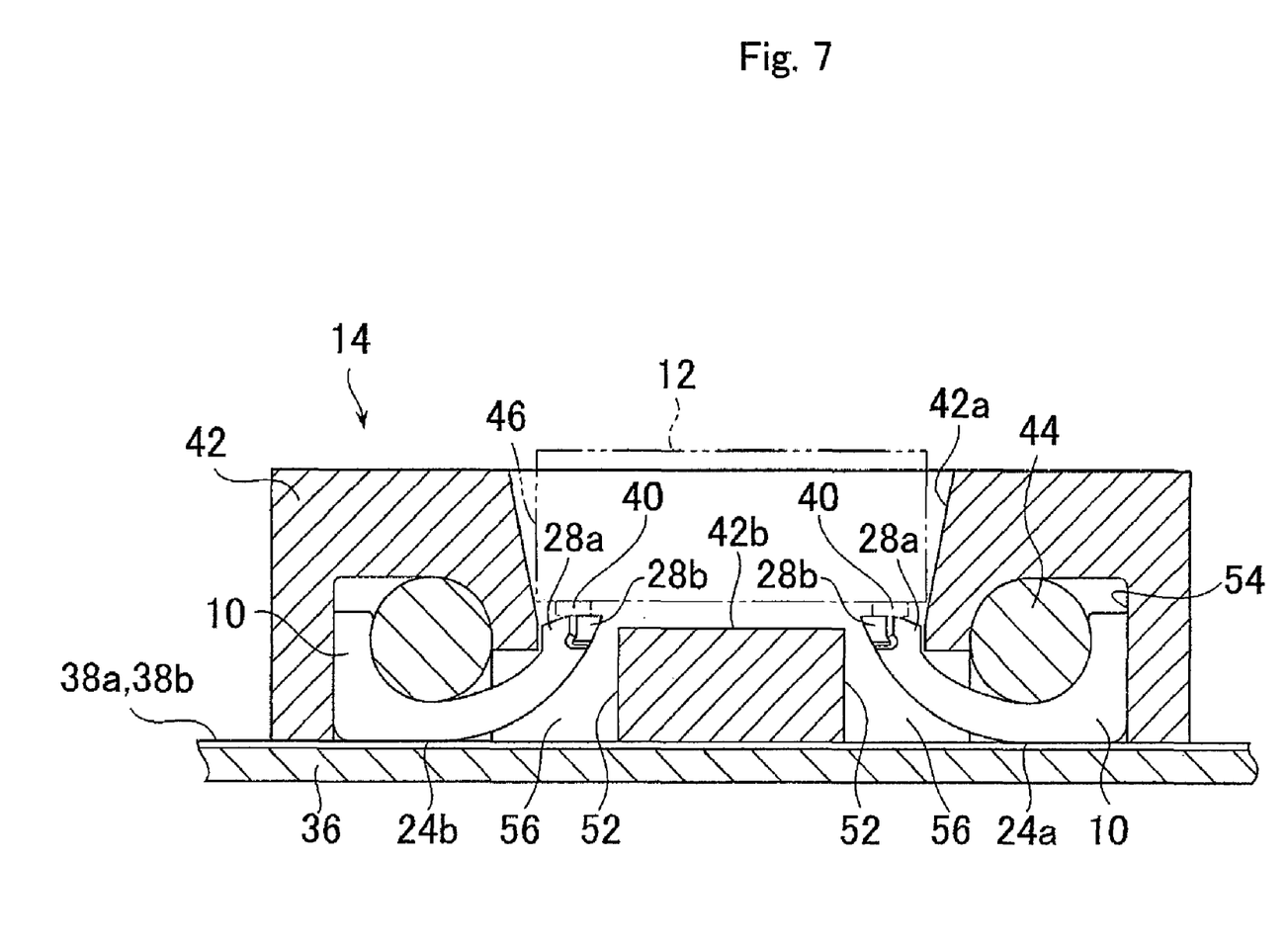
FIG. 7 is a sectional view obtained along the line 7-7 in FIG. 5.

The first conductive contact portion 24a of the assembled contact 10 is pressed against one of conductive portions 38a formed in a base plate 36. The second conductive contact portion 24b is pressed against the other conductive portion 38b formed in the base plate 36.

The first and second terminal contact portions 28a and 28b are disposed side by side in the X direction so as to receive a terminal 40. A gap A is formed between the first and second terminal contact pieces 28a and 28b disposed side by side (see FIG. 3C).

The first and second terminal contact portions 28a and 28b are pressed against the common terminal 40 of the semiconductor device 12 at the time of inspection. At this time, the first terminal contact portion 28a is extended toward the second base portion 20b without electrically contacting with the second contact piece 16b. Also, the second terminal contact portion 28b is extended toward the first base portion 20a without electrically contacting with the first contact piece 16a.

Figure 3A:
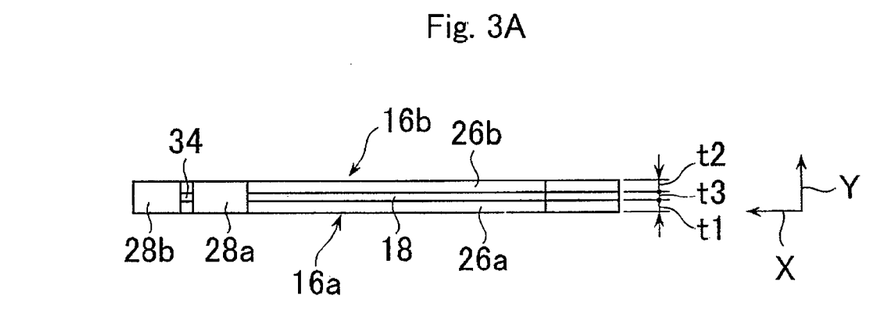
FIG. 3A is a top plan view of the contact shown in FIG. 2.

As shown in FIG. 3A, the first terminal contact portion 28a has a thickness dimension which is the total dimension of the thickness t1 of the first body portion 26a, the thickness t2 of the second body portion 26b and the thickness t3 of the electrical insulator 18. It suffices, however, that the thickness dimension of the first terminal contact portion 28a ranges from one greater than the total dimension of the thickness t2 and the thickness t3 to one smaller than the total dimension of the thickness t1, the thickness t2 and the thickness t3.

The second terminal contact portion 28b has a thickness dimension which is the total dimension of the thickness t1 of the first body portion 26a, the thickness t2 of the second body portion 26b and the thickness t3 of the electrical insulator 18. It suffices, however, that the thickness dimension of the second terminal contact portion 28b ranges from one greater than the total dimension of the thickness t1 and the thickness t3 and one smaller than the total dimension of the thickness t1, the thickness t2 and the thickness t3.

The electrical insulator 18 has the body portion 18a, a first contact preventing portion 32 for preventing electrical connection between the first terminal contact portion 28a and the second base portion 20b as well as electrical connection between the second terminal contact portion 28b and the first base portion 20a, and a second contact preventing portion 34 for preventing electrical contact between the first terminal contact portion 28a and the second terminal contact portion 28b. The first contact preventing portion 32 is formed in the body portion 18a.

The shapes and dimensions of the body portion 18a with the first contact preventing portion 32 and the second contact preventing portion 34 excepted from the electrical insulator 18 and the first base portion 20a are made substantially the same.

The second contact preventing portion 34 is projected into the gap formed between the first terminal contact portion 28a and the second terminal contact portion 28b. The second contact preventing portion 34 is formed in the first contact preventing portion 32.

The first and second base portions 20a and 20b are overlapped in the thickness direction (Y direction) with the electrical insulator 18 interposed between both base potions 20a and 20b. Both contact pieces 16a, 16b are adhered by an adhesive applied to the electrical insulator 18.

The electrical insulator 18 includes a pair of confronted electrical insulating sheets. This pair of electrical insulating sheets are adhered by an adhesive applied to the electrical insulating sheet.

As shown in FIG. 3A and FIG. 3C, since the second contact preventing portion 34 is projected into the gap formed between the first terminal contact portion 28a and the second terminal contact portion 28b and prevents electrical contact between the first terminal contact portion 28a and the second terminal contact portion 28b, the electrical contact between the first contact piece 16a and the second contact piece 16b can be surely prevented.

Figure 3B:
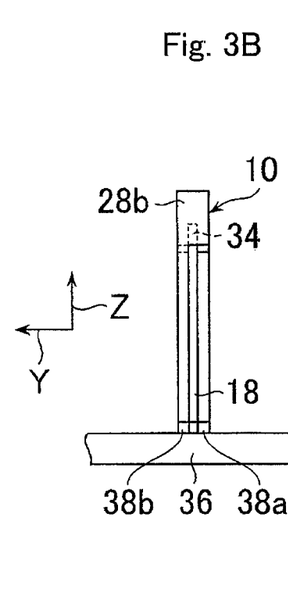
FIG. 3B is a left side view of the contact shown in FIG. 2.
Figure 3C:
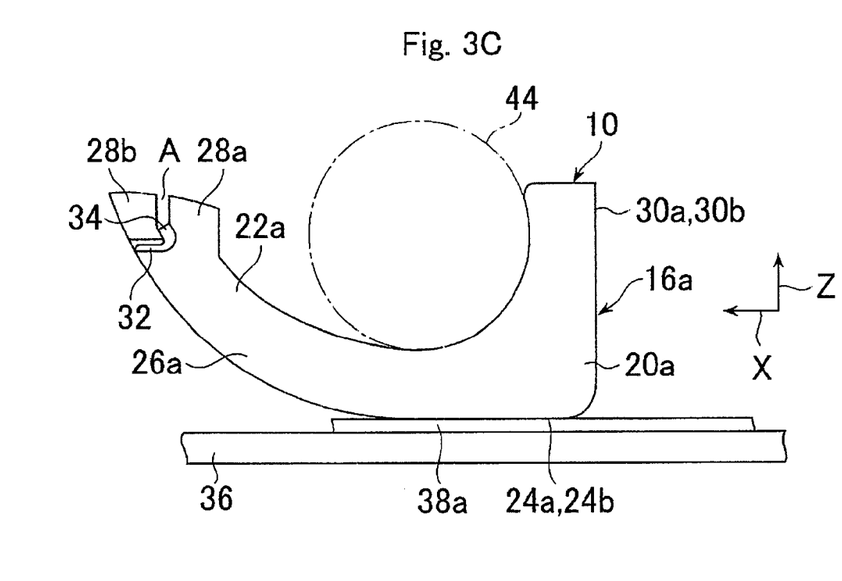
FIG. 3C is a front elevation of the contact shown in FIG. 2.

As shown in FIG. 3B and FIG. 3C, the first contact preventing portion 32 is positioned above the position of the top face of the first base portion 20a in the Z direction and below the position of the underside of the second terminal contact portion 28b. This surely prevents electrical contact between the second terminal contact portion 28b and the first contact piece 16a.

As shown in FIG. 4, the first contact preventing portion 32 is positioned above the position of the top face of the first base portion 20b in the Z direction and below the position of the underside of the first terminal contact portion 28a. This surely prevents the electrical contact between the first terminal contact portion 28a and the first contact piece 16b.

Electrical Connecting Apparatus

Figure 5:
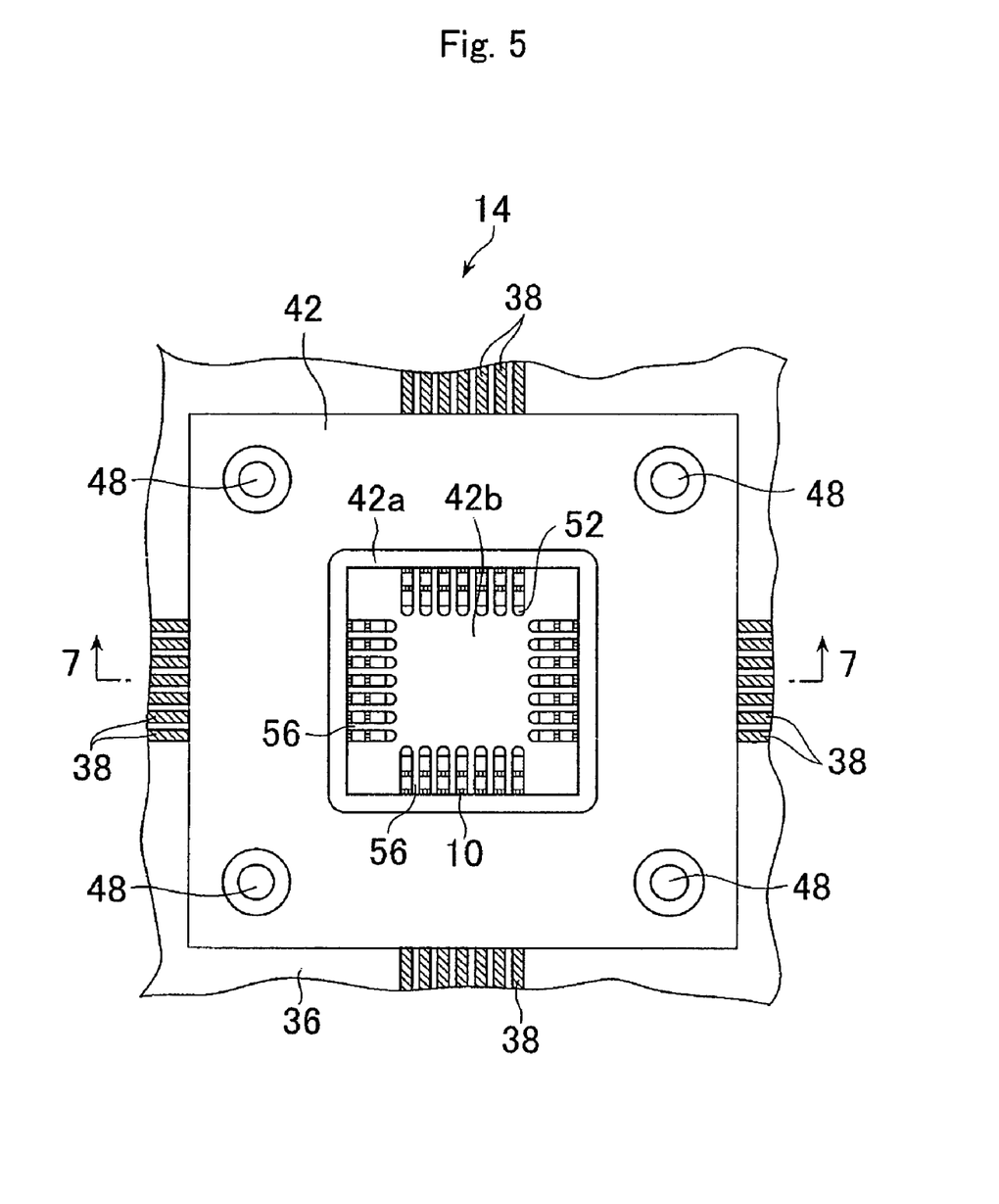
FIG. 5 is a top plan view of the electrical connecting apparatus according to the present invention in which the contact shown in FIG. 2 is used.
Figure 6:
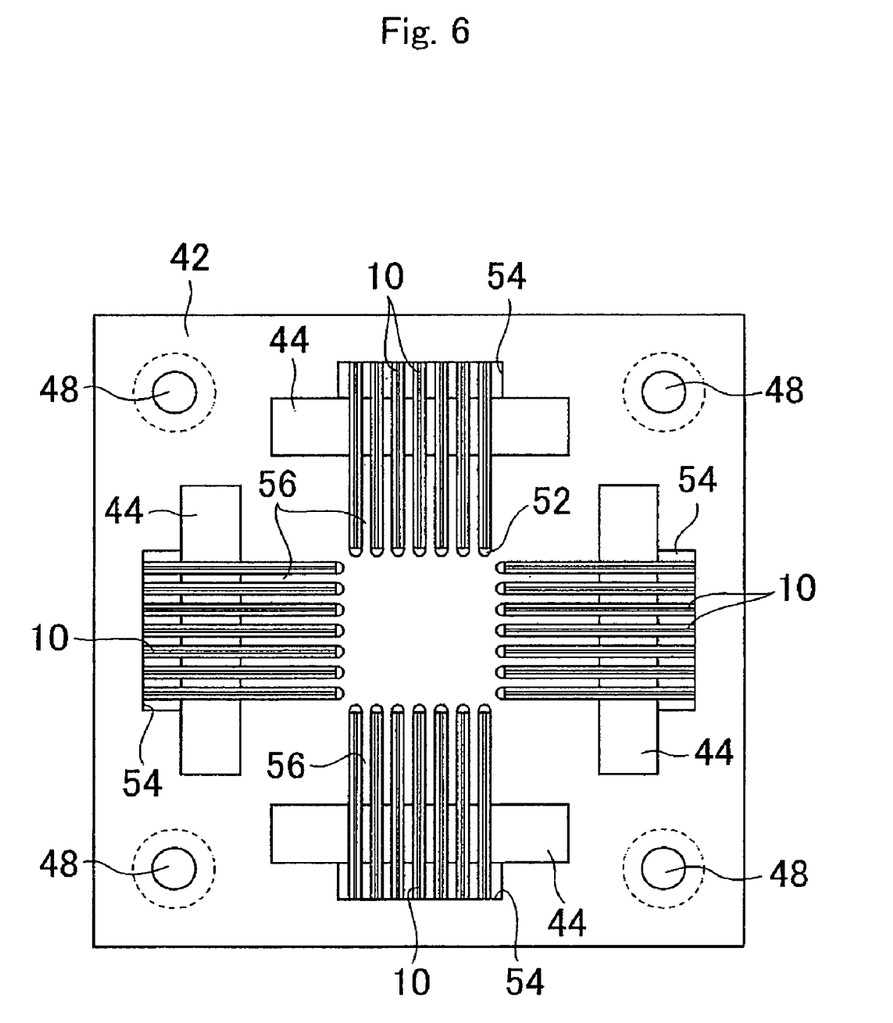
FIG. 6 is a bottom view of the electrical connecting apparatus shown in FIG. 5.

Referring to FIGS. 5 through 7, the electrical connecting apparatus 14 comprises the base plate 36, a plurality of contacts 10 made to correspond individually to the terminals 40, a flat plate-like cover or a plate-like body 42 for assembling the contacts 10 into the base plate 36, and a plurality of rod-like elastic bodies 44 for assembling the contacts into the plate-like body 42. The plate-like body 42 and the electric bodies 44 act as an assembler.

The semiconductor device 12 has a body portion 46 packaged or molded in a rectangular planar shape and a plurality of terminals 40 projecting downward from the underside of each side of the rectangle (see FIG. 7). The terminal 40 is a so-called PAD terminal. The terminals 40 are divided into a plurality of terminal groups made to correspond individually to the sides of the rectangle. Also, the terminals 40 are arranged in parallel in every terminal group.

The base plate 36 is a wiring base plate with a wiring pattern formed on one face of an electrical insulating material by a printed wiring technique. The base plate 36 has on one face a plurality of strip-like printed wiring portions 38 individually made to correspond individually to the contacts 10. Each printed wiring portion 38 is a part of the wiring pattern, and is divided into the first conductive portion 38a and the second conductive portion 38b.

The wiring portions 38 are divided into a plurality of wiring portion groups made to correspond individually to the sides of the rectangle of the body portion 46 of the semiconductor device 12. Also, the printed wiring portions 38 are arranged in parallel in every wiring portion group.

Each pair of first and second conductive portions 38a and 38b is made to correspond to the terminal 40 of the semiconductor device 12, in turn, to the contact 10.

The plate-like body 42 is assembled into the base plate 36 in a mutually overlapped state by a plurality of screw members 48. The plate-like body 42 has a plurality of slits 52 and a recess 54, for each wiring portion group. The elastic body 44 with a circular section is disposed.

The slits 52 are extended in the longitudinal direction of the printed wiring portion 38, penetrate the plate-like body 42, and are further communicated to the recess 54.

The recess 54 extends in the direction of arrangement of the plural contacts 10. Also, the recess 54 is opened on the side of the base plate 36. Adjoining slits 52 are partitioned by a partition 56.

Each contact 10 is inserted into the corresponding slit 52 so that the X direction of each contact 10 may become the longitudinal direction of the printed wiring portion 38.

The first and second terminal contact portions 28a and 28b of each contact 10 penetrate the corresponding slit 52.

The upper ends of the first and second terminal contact portions 28a and 28b penetrating the slit 52 project upward from the bottom face 42b of an opening portion 42a of the plate-like body 42. The rear ends 30a and 30b of the contact 10 are disposed in the plate-like body 42 in a state of being received in the recess 54 and with the rear ends 30a and 30b brought into contact with a back face 58 of the recess 54.

The elastic body 44 is rod-shaped, in the drawing, using an elastic material such as silicone rubber. The elastic body 44 is extended in the thickness direction of the contact 10 within the recess 54.

The elastic body 44 is positioned between the contact 10 and the plate-like body 42 in a state of being assembled into the electrical connecting apparatus 14. Also, the elastic body 44 engages a curved portion of the contact 10 so that the first conductive contact portion 24a of the first contact piece 16a may be in contact with one conductive portion 38a and that the second conductive contact portion 24b of the second contact piece 16b may be in contact with the other conductive portion 38b.

The electrical connecting apparatus 14 can be assembled by assembling the plate-like body 42 into the base plate 36 in that state. Therefore, the contacts 10 can be easily and correctly arranged in parallel in the plate-like body 42.

In the assembled state, the contacts 10 are maintained in a stable state by the slits 52 and the elastic body 44. Also, adjoining contacts 10 are prevented by the partition 56 from short-circuiting due to electrical contact.

When Testing a Semi-Conductor Device

Figure 8:
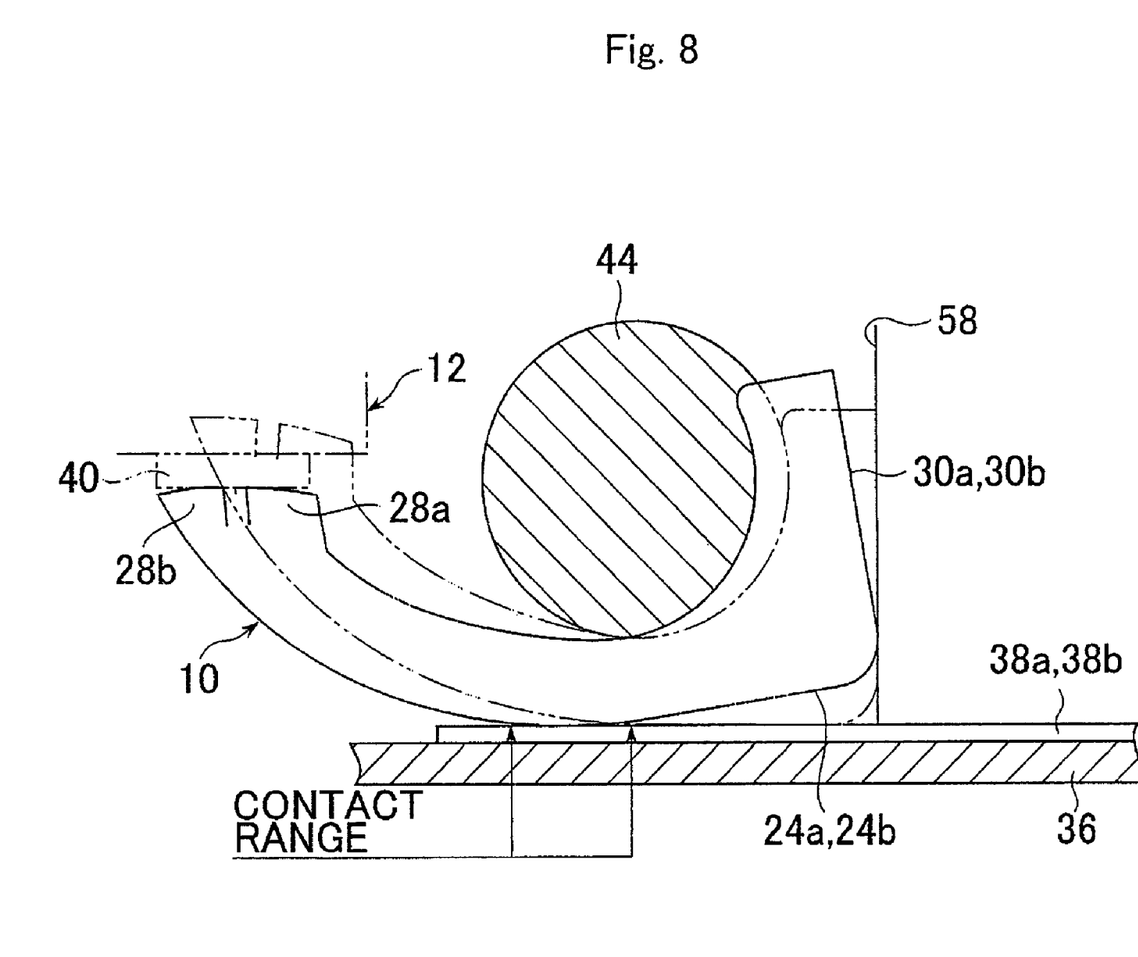
FIG. 8 is a schematic view for explaining a movement of the contact of the electrical connecting apparatus shown in FIG. 7.

As shown in FIG. 8, when the terminal 40 of the semiconductor device 12 is pressed against the first and second terminal contact portions 28a and 28b of the contact 10 at the time of testing, the contact pieces 16a and 16b of each contact 10 are pressed against the terminal 40 in common, and pressed individually against the conductive portions 38a and 38b.

By this, even if the terminal 40 is pressed against the contact 10 with a displacement in the X direction or Y direction, the first and second terminal contact portions 28a and 28b can come into electrical contact with the underside of the terminal 40 of the semiconductor device 12 over a wide area. The first and second terminal contact portions 28a and 28b can, therefore, ensure the Kelvin connection between the contact 10 and the terminal 40.

At this time, both contact pieces 16a and 16b are overlapped in the thickness direction, interposing the electrical insulator 18 therebetween, so that both contact pieces 16a and 16b displace in a body. The pressing conditions, in turn, the electrical contact conditions of both contact pieces 16a and 16b against the terminal 40 and the conductive portions 38a, 38b are made the same, and in spite of being the Kelvin connection, conditions of the electrical connection between the contact 10 and the terminal 40 as well as between the contact pieces 16a, 16b and the conductive portions 38a, 38b are stabilized.

Also, when the terminal 40 is pressed against the contact 10, the elastic body 44 is pressed by the contact 10 to be dented partially. Due to this and because the contact is passed through the slit 52, the contact 10 is prevented from collapsing.

Further, when the terminal 40 is pressed against the contact 10, the contact 10 partially dents the elastic body 44 and brings its rear end into contact with the back face 58 without retreating, and the contact pieces 16a, 16b displace in one body counterclockwise in FIG. 8 such that portions of the contact 10 in contact with the conductive portions 38a, 38b change to the front end side.

At this time, the contact 10, whose rear ends 30a, 30b are pressed against the back face 58 of the recess 54 by restoring force of the elastic body 44, slightly slides relative to the terminal 40 and the conductive portions 38a, 38b. By this sliding, a so-called scraping action is caused, by which the oxide film of the surface of the terminal 40 and the conductive portions 38a, 38b are scraped.

Also, since the electrical insulating sheets of the electrical insulator 18 are overlapped by the adhesive, both electrical insulating sheets are capable of parallel displacement relatively.

For this reason, when the contact 10 is pressed against the terminal 40 and the conductive portions 38a, 38b in a state of being inclined to the terminal 40 and the conductive portions 38a, 38b, both contact pieces 16a, 16b relatively move against the adhesive strength of the adhesive.

This brings the first contact piece 16a surely into contact with the terminal 40 and the first conductive portion 38a and the second contact piece 16b surely contact the terminal 40 and the second conductive portion 38b.

Examples of Transformation of the Contact

Figure 9A:
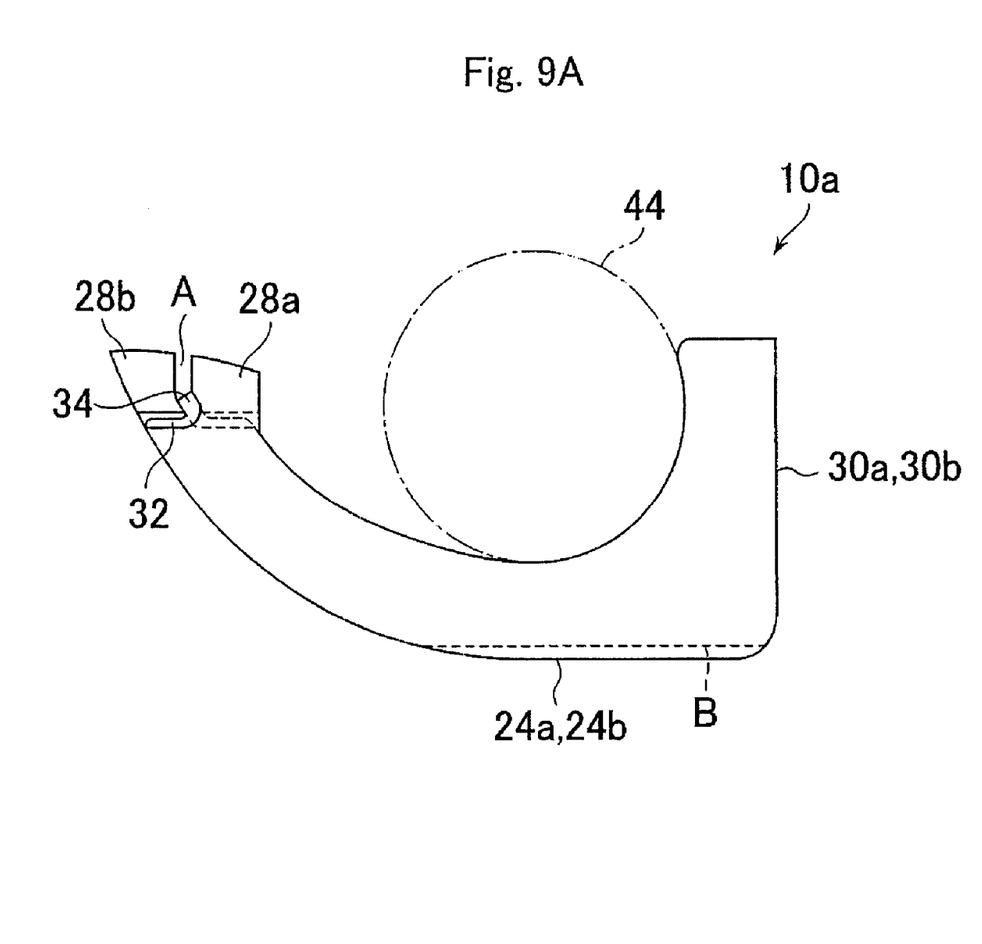
FIG. 9A is a front elevation showing a second embodiment of the contact according to the present invention.
Figure 9B:
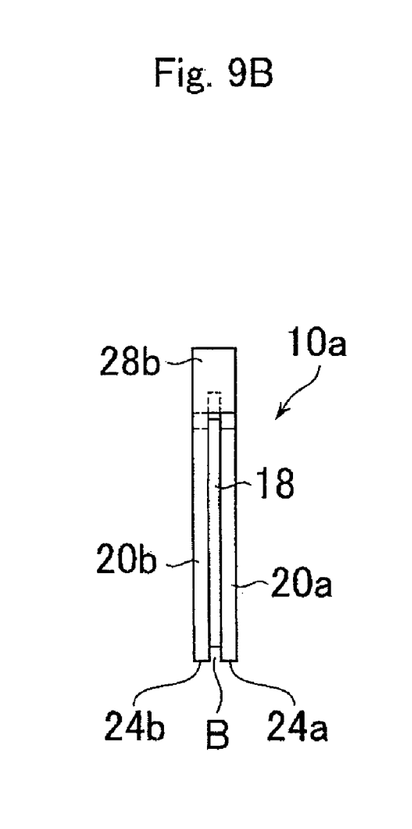
FIG. 9B is a left side view of the contact shown in FIG. 9A.

While the shapes and dimensions of the first base portion 20a of the contact 10 and the body portion 18a of the electrical insulator 18 are made substantially the same, a contact 10a may form a space B having no electrical insulator 18 between the lower end portion of a first contact piece 16a and the lower end portion of a second contact piece 16b, as shown in FIG. 9. By doing so, even if there are more or less irregularities in the terminal 40 as well as in the first and second conductive portions 38a, 38b, the first contact piece 16a is surely brought into contact with the terminal 40 and the first conductive portion 38a, and the second contact piece 16b is surely brought into contact with the terminal 40 and the second conductive portion 38b.

The present invention can be also applied not only to a J-shaped contact as mentioned above but also to a contact with another shape.

Figure 10:
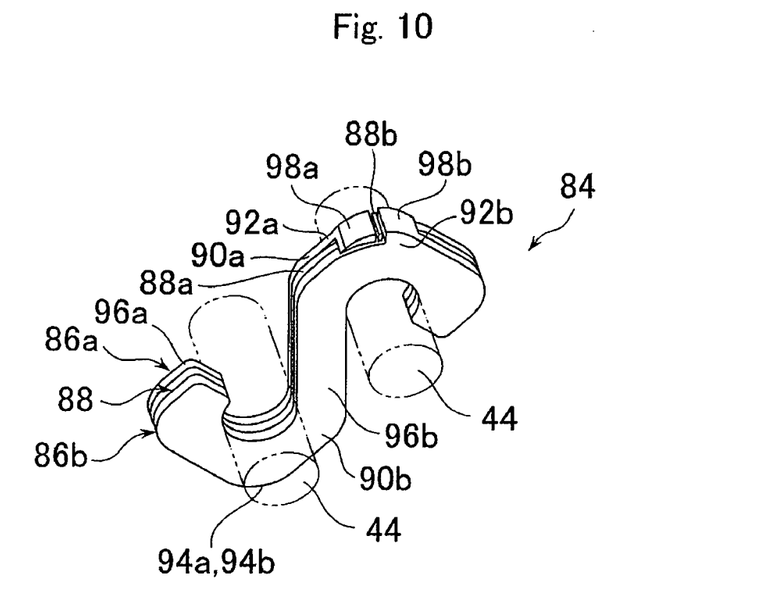
FIG. 10 is a perspective view of the contact to be used in another embodiment of the electrical connecting apparatus shown in FIG. 5.
Figure 11:
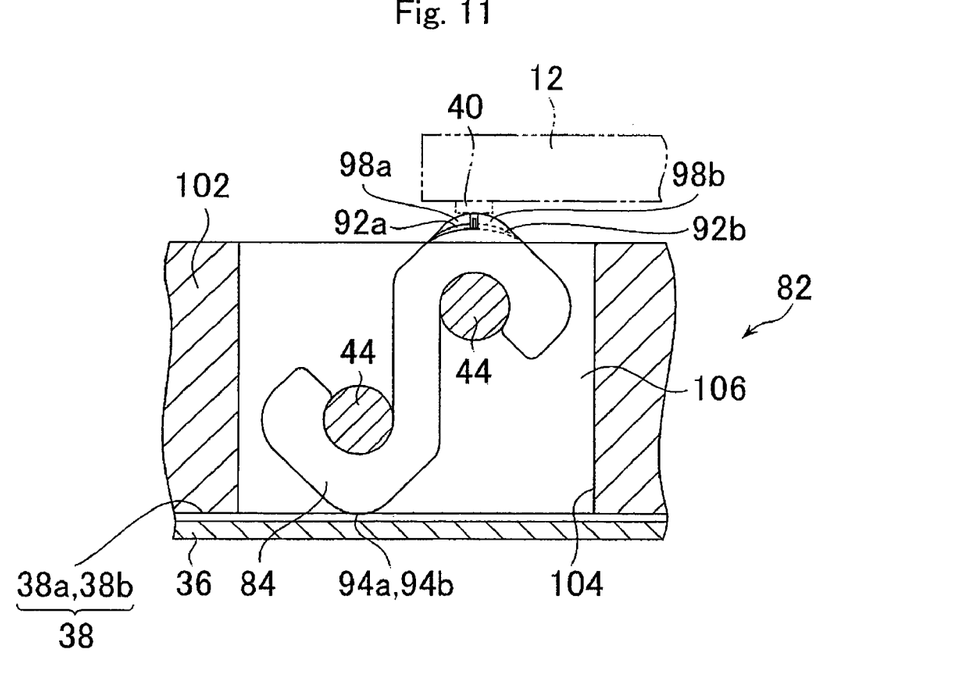
FIG. 11 is a sectional view of the electrical connecting apparatus using the contact shown in FIG. 10.

Referring to FIGS. 10 and 11, the electrical connecting apparatus 82 uses S-shaped (or Z-shaped) contacts 84. Each contact 84 includes a first and a second contact pieces 86a and 86b as well as at least one sheet-like electrical insulator 88 like polyimide.

The contact 84 overlaps the first and second contact pieces 86a and 86b in the thickness direction in a state of interposing the electrical insulator 88 between the first and second contact pieces 86a and 86b. The first and second contact pieces 86a, 86b are adhered by an adhesive applied to the electrical insulator 88.

The first contact piece 86a has a first base portion 90a, a first elongate portion 92a extending from the first base portion 90a, a plate-like first body portion 96a having a first conductive contact portion 94a formed in the first base portion 90a, and a first terminal contact portion 98a formed in the first elongate portion 92a.

The second contact piece 86b has a second base portion 90b, a second elongate portion 92b extending from the second base portion 90b, a plate-like second body portion 96b having a second conductive contact portion 94b formed in the second base portion 90b, and a second terminal contact portion 98b formed in the second elongate portion 92b.

The electrical insulator 88 has a body portion 88a, and a contact preventing portion 88b for preventing electrical contact between the first terminal contact portion 98a and the second terminal contact portion 98b. The contact preventing portion 88b is formed in the body portion 88a. The shapes and the dimensions of the body portion 88a and the base portion 90a are made substantially the same.

Each of the first and second body portions 96a and 96b has an S-like shape having a first arcuate portion and a second arcuate portion. Also, each of the first and second terminal contact portions 98a and 98b is positioned outside the first artuate portion. Each of the first and second conductive contact portions 94a and 94b is positioned outside the second arcuate portion.

The first and second conductive contact portions 94a and 94b are individually brought into electrical contact with the first and second conductive portions 38a and 38b. The first and second terminal contact portions 98a and 98b are brought into electrical contact with the terminal 40 corresponding to the contact 84.

A plate-like body 102 used in the electrical connecting apparatus 82 is provided with a plurality of slits 104 to receive the contact 84. Each slit 104 penetrates in the thickness direction of the plate-like body 102 and extends in the longitudinal direction of the first and second conductive portions 38a and 38b. Adjoining slits 104 are partitioned by a partition 106.

The electrical connecting apparatus 82 uses two elastic bodies 44 per contact group. Each elastic body 44 extends through the partition 106. One of the elastic bodies 44 is in contact with the inside of the first arcuate portion. The other elastic body 44 is in contact with the inside of the second arcuate portion.

The electrical connecting apparatus 82 can be assembled into the base plate 36 by mounting the two elastic bodies 44 on the plate-like body 102 and such that the contact 84 is engaged with both elastic bodies 44.

In the assembled state, each contact 84, penetrating the slit 104 obliquely, makes the first and second conductive contact portions 94a and 94b abut on the first and second conductive portions 38a and 38b. Further, each contact 84 makes the terminal contact portions 98a and 98b project from the plate-like portion 102.

In this state, when the terminal 40 is pressed against the contact 84, the contact 84 is pressed against the terminal 40 and the first and second conductive portions 38a and 38b to be slightly angularly rotated clockwise in FIG. 11, thereby giving scraping action to the terminal 40 and the first and second conductive portions 38a and 38b.

Figure 12:
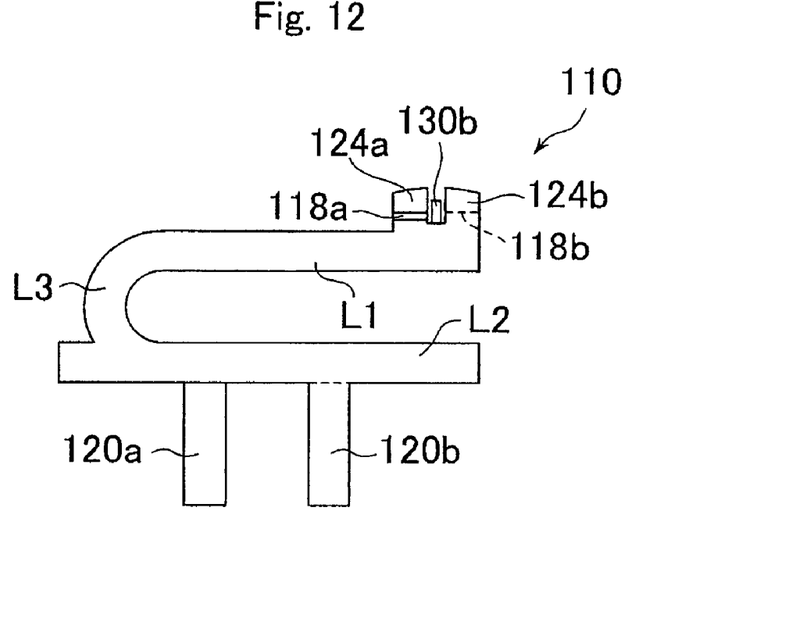
FIG. 12 is a front elevation of the contact used in yet another embodiment of the electrical connecting apparatus shown in FIG. 5.
Figure 13:
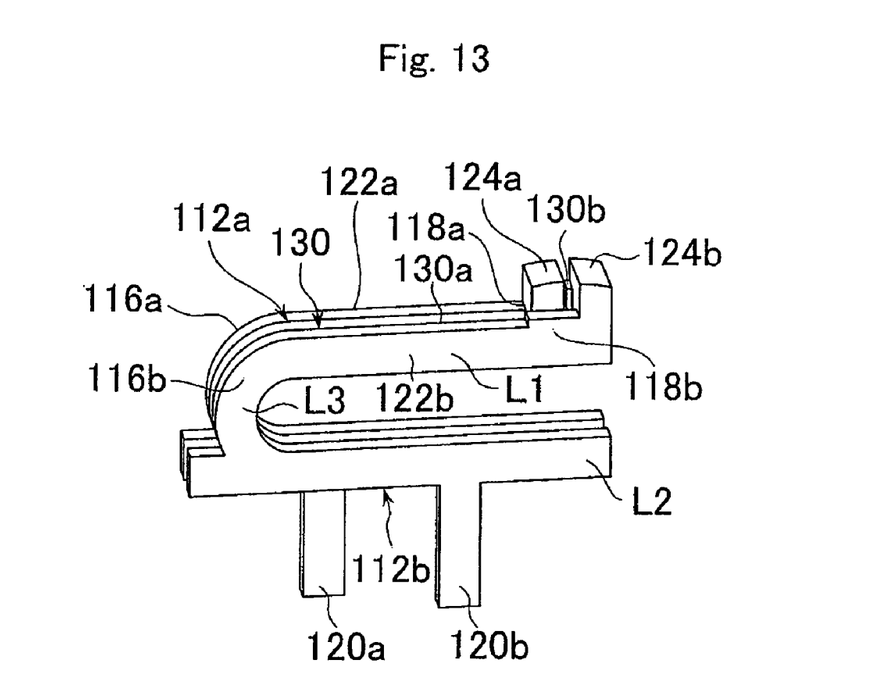
FIG. 13 is a perspective view of the contact shown in FIG. 12.

Referring to FIGS. 12 and 13, a contact 110 includes a first and a second contact pieces 112a and 112b having conductivity and at least one sheet-like electrical insulator 130 such as polyimide.

The contact 110 overlaps the electrical insulator 130, the first and second contact pieces 112a and 112b in the thickness direction, interposing the electrical insulator 130. The first and second contact pieces 112a, 112b are adhered by an adhesive applied to the electrical insulator 130.

The first contact piece 112a has a plate-like first body portion 122a and a first terminal contact portion 124a. The first body portion 122a has a first base portion 116a, a first elongate portion 118a extending from the first base portion 116a, and a first conductive contact portion 120a formed in the first base portion 116a. The first terminal contact portion 124a is formed in the first elongate portion 118a.

The second contact piece 112b has a second base portion 116b, a second elongate portion 118b extending from the second base portion 116b, a plate-like second body portion 122b having a second conductive contact portion 120b formed in the second base portion 116b, and a second terminal contact portion 124b formed in the second elongate portion 118b.

The first and second body portions 122a and 122b have substantially U-like shapes having two linear portions L1, L2 parallel to each other, and a curved portion L3 formed between both linear portions L1 and L2 and joining both linear portions L1 and L2.

The first and second elongate portions 118a and 118b are formed at the front end portion of the linear portion L1. The first and second conductive contact portions 120a and 120b are formed in the linear portion L2. The first conductive contact portion 102a and the second conductive contact portion 120b extend in parallel from the underside at a distance in FIG. 12.

The electrical insulator 130 has a body portion 130a, a contact preventing portion 130b for preventing electrical contact between the first terminal contact portion 124a and the second terminal contact portion 124b. The contact preventing portion 130b is formed in the body portion 130a. The shapes and dimensions of the body portion 130a and the first base portion 116a are made substantially the same.

The first and second body portions 122a and 122b of the contact 110, having substantially U-like shapes, can greatly displace vertically in FIG. 12. Consequently, even by pressing the terminals 40 against the contact 110 in a state where the semiconductor device 12 is a little inclined, a stroke of each terminal 40 caused by the inclination of the semiconductor device 12 can be absorbed.

The present invention is not limited to the foregoing embodiments. For example, the contact may have a simple shape such as an arc-like shape, a one-side open rectangular shape, an L-shape, a V-shape, a W-shape, etc. Also, it may be used in a state that the upper and lower sides in the foregoing embodiments are inverted. The present invention, therefore, can be variously modified without departing from its spirit.

What is claimed is:

1. A contact comprising:
   a first contact piece including a plate-like first body portion having a first base portion, a first elongate portion extending from said first base portion, and a first conductive contact portion formed in said first base portion and pressed against one conductive portion formed in a base plate; and a first terminal contact portion formed in said first elongate portion and pressed against a terminal of a semiconductor device;
   a second contact piece including a plate-like second body portion having a second base portion, a second elongate portion extending from said second base portion, and a second conductive contact portion formed in said second base portion and pressed against the other conductive portion formed in said base plate; and a second terminal contact portion formed in said second elongate portion and pressed against said terminal; and
   at least one sheet-like electrical insulator disposed between said first base portion and said second base portion;
   wherein said first and second base portions are made to confront in their thickness direction, interposing said electrical insulator,
   wherein said first terminal contact portion extends toward said second base portion without being brought into electrical contact with said second contact piece, and
   wherein said second terminal contact portion extends toward said first base portion without being brought into electrical contact with said first contact piece.

2. A contact as claimed in claim 1, wherein said electrical insulator has a first contact preventing portion for preventing electrical contact between said first terminal contact portion and said second base portion as well as electrical contact between said second terminal contact portion and said first base portion.

3. A contact as claimed in claim 1, wherein said electrical insulator has a second contact preventing portion projected in a gap formed between said first terminal contact portion and said second terminal contact portion and for preventing electrical contact between said first terminal contact portion and said second terminal contact portion.

4. A contact as claimed in claim 1,
   wherein said electrical insulator has a first contact preventing portion for preventing electrical contact between said first terminal contact portion and said second base portion as well as electrical contact between said second terminal contact portion and said first base portion; and
   wherein a second contact preventing portion projected in a gap formed between said first terminal contact portion and said second terminal contact portion and for preventing electrical contact between said first terminal contact portion and said second terminal contact portion; and
   wherein said second contact preventing portion is formed in said first contact preventing portion.

5. A contact as claimed in claim 1,
   wherein said first terminal contact portion has, in said thickness direction, a thickness dimension greater than the total dimension of the thickness of said first body portion and the thickness of said electrical insulator and the same as or smaller than the total dimension of the thickness of said first body portion, the thickness of said electrical insulator and the thickness of said second body portion;

wherein said second terminal contact portion has, in said thickness direction, a thickness dimension greater than the total dimension of the thickness of said first body portion and the thickness of said electrical insulator, and the same as or smaller than the total dimension of the thickness of said first body portion, the thickness of said electrical insulator and the thickness of said second body portion.

6. A contact as claimed in claim 1, wherein a space is formed between said first conductive contact portion and said second conductive contact portion.

7. A contact as claimed in claim 1, wherein said electrical insulator includes a pair of electrical insulation sheets and within an adhesive is disposed between said pair of electrical insulation sheets.

8. An electrical connecting apparatus for electrically connecting a plurality of terminals of a semiconductor device and a conductive portion formed in one face of said base plate, comprising a plurality of contacts respectively claimed in any one of claims 1 through 7, and an assembler for assembling said contacts in parallel on said base plate;

wherein said assembler is provided with a plate-like body assembled into said base plate said plate-like body having a plurality of slits extending in a direction intersecting the aligning direction of said contacts; and at least one elastic body for assembling said contacts in said plate-like body; and wherein said first and second terminal contact portions of each contact penetrate said slit.

9. An electrical connecting apparatus as claimed in claim 8, wherein said first body portion is bent substantially in J-like shape from said first terminal contact portion to said first conductive contact portion;

wherein said second body portion is bent substantially in J-like shape from said second terminal contact portion to said second conductive contact portion; and wherein said elastic body is in contact with the substantially J-shaped curved portion of said contact.

10. An electrical connecting apparatus as claimed in claim 8, wherein each of said first and second body portions has a substantially S-like shape which has a first arcuate portion and a second arcuate portion;

wherein said first and second terminal contact portions are respectively positioned outside said first arcuate portions;

wherein said first and second conductive contact portions are respectively positioned outside said second arcuate portions; and wherein said assembler have at least two elastic bodies, one of which is in contact with the inside of said first arcuate portion, and the other of which is in contact with the inside of said second arcuate portion.

11. An electrical connecting apparatus as claimed in claim 8, wherein a first and a second body portions have a substantially U-like shape having two linear portions parallel to each other, and a curved portion formed between the liner portions and connecting both linear portions;

wherein said first and second elongate portions are respectively formed in one of said linear portions; and wherein said first and second conductive contact portions are respectively formed in the other of said linear portions.

* * * * *

UNITED STATES PATENT AND TRADEMARK OFFICE
CERTIFICATE OF CORRECTION

PATENT NO.        : 7,303,404 B2
APPLICATION NO.   : 11/603361
DATED             : December 4, 2007
INVENTOR(S)       : Eichi Osato and Yoshihito Goto It is certified that error appears in the above-identified patent and that said Letters Patent is hereby corrected as shown below:

On the title page, please add the following:
Item "(30) Foreign Application Priority Data
Jun. 3, 2004 (WO) . . . PCT/JP04/08072"

Signed and Sealed this

Nineteenth Day of May, 2009

JOHN DOLL
*Acting Director of the United States Patent and Trademark Office*